United States Patent
Müller et al.

(10) Patent No.: US 8,425,793 B2
(45) Date of Patent: Apr. 23, 2013

(54) PROCESS AND DEVICE FOR CLEANING AND ETCHING A SUBSTRATE WITH A TRANSPARENT CONDUCTIVE OXIDE LAYER

(75) Inventors: Joachim Müller, Fellbach (DE); Gunnar Schöpe, Linnich (DE); Hildegard Siekmann, Kerkrade (NL); Bernd Rech, Berlin (DE); Tobias Repmann, Alzenau (DE); Wolfgang Apenzeller, Titz (DE); Brigitte Sehrbrock, Jülich (DE)

(73) Assignee: Forschungszentrum Juelich GmbH

( * ) Notice: Subject to any disclaimer, the term of this patent is extended or adjusted under 35 U.S.C. 154(b) by 922 days.

(21) Appl. No.: 11/547,869

(22) PCT Filed: Mar. 31, 2005

(86) PCT No.: PCT/DE2005/000563
§ 371 (c)(1),
(2), (4) Date: Aug. 21, 2008

(87) PCT Pub. No.: WO2005/101522
PCT Pub. Date: Oct. 27, 2005

(65) Prior Publication Data
US 2008/0296262 A1 Dec. 4, 2008

(30) Foreign Application Priority Data
Apr. 10, 2004 (DE) .................. 10 2004 017 680

(51) Int. Cl.
*C03C 15/00* (2006.01)
(52) U.S. Cl.
USPC ............ 216/83; 216/37; 438/98; 438/610; 205/155; 205/188; 205/333

(58) Field of Classification Search ........... 216/37, 216/83; 438/98, 610; 138/244, 258, 260, 138/264
See application file for complete search history.

(56) References Cited

U.S. PATENT DOCUMENTS

| | | | |
|---|---|---|---|
| 5,501,744 A * | 3/1996 | Albright et al. | 136/258 |
| 5,924,967 A * | 7/1999 | Furlani et al. | 492/54 |
| 6,620,645 B2 * | 9/2003 | Chandra et al. | 438/98 |

FOREIGN PATENT DOCUMENTS

| | | |
|---|---|---|
| DE | 196 00 985 | 7/1987 |
| DE | 197 13 215 | 8/1998 |
| DE | 199 08 960 | 7/2000 |

OTHER PUBLICATIONS

J. Muller et al. Thin Solid Films, vol. 392, (2001) pp. 327-333.*

(Continued)

*Primary Examiner* — Nadine Norton
*Assistant Examiner* — Maki Angadi
(74) *Attorney, Agent, or Firm* — Andrew Wilford

(57) ABSTRACT

A simple process is disclosed for treating substrates having pre-structured zinc oxide layers on rigid or flexible supports. The ZnO is treated with an etching medium then with a cleaning liquid. The treatment with the etching and cleaning liquids is carried out while the substrate is conveyed through a device. The process is technically simple to implement and makes it possible to regularly and homogeneously roughen and texturize ZnO layers of up to 1 m$^2$. The device for treating substrates having pre-structured zinc oxide layers on rigid or flexible supports has for that purpose a first means for treating the substrate with an etching liquid, a second means for treating the substrate with a cleaning liquid, and another means, in particular transport rollers, for conveying the substrate from the first to the second means.

17 Claims, 1 Drawing Sheet

OTHER PUBLICATIONS

S. Brown et al. Photovoltaic Manufacturing Technology, Phase I, Apr. 1991 pp. 1-54.*
H. Dong et al, Wear, vol. 238, (2000), pp. 131-137.*
Upscaling of Texture-Etched Zinc Oxide Substrates . . . By Müller et al. (Solid Films, 392 (2001) 327-333.

* cited by examiner

PROCESS AND DEVICE FOR CLEANING AND ETCHING A SUBSTRATE WITH A TRANSPARENT CONDUCTIVE OXIDE LAYER

CROSS REFERENCE TO RELATED APPLICATIONS

This application is the US-national stage of PCT application PCT/DE2005/000563 filed 31 Mar. 2005, published 27 Oct. 2005 as WO2005/101522, and claiming the priority of German patent application 102004017680.9 itself filed 10 Apr. 2004, whose entire disclosures are herewith incorporated by reference.

FIELD OF THE INVENTION

The invention relates to a method for cleaning and etching a substrate that has a transparent and conductive oxide layer (TCO), particularly a zinc-oxide layer such as that used when producing solar modules. Furthermore, the invention relates to an device for executing the described method.

STATE OF THE ART

The production of silicon thin-film solar modules on the basis of amorphous or microcrystalline silicon and/or alloys thereof makes, among other things, a structuring of the front TCO ("transparency conductive oxide") contact necessary. Normally, this structuring takes place exclusively with the help of laser ablation, which leaves layer residue on the surface. This must be removed prior to further coating of the entire substrate surface, which ranges around 1 $m^2$ for industrial module production. Consequently, a cleaning step is necessary in any case. The complete separation of the TCO layer is critical for the function of the components and absolutely essential for a high yield.

In industrial module production with substrate sizes of about 1 $m^2$, cleaning is normally a necessary and independent process step that takes place after the laser structuring of the TCO and before the application of further layers. One of the technical constructions used for this purpose is for example a brush-washing device. When using zinc oxide (ZnO) produced by magnetron sputtering as the TCO material, additionally a roughening of the surface layer must take place to ensure sufficient scattering of the incident sunlight. This roughening takes place most simply by means of wet chemical etching in a diluted acid or lye. Textured zinc oxide as the front TCO material is not yet used in the production of silicon thin-film solar modules. Therefore, no industrial solution using wet chemical etching currently exists.

For the production of small-surface solar cells and solar is modules on a laboratory scale with typical substrate sizes of 10×10 $cm^2$, wet chemical textured ZnO produced by magnetron sputtering is used as the front TCO material in the Photovoltaic Institute at Forschungszentrum Jülich GmbH. During the production of solar modules on a substrate surface of up to 10×10 $cm^2$, cleaning is carried out after laser structuring in combination with wet chemical texturing as one process step. The substrates coated with ZnO are thereby manually immersed for about 10 seconds in a diluted (approx. 0.5%) hydrochloric acid solution at room temperature. The exact temperature is not controlled at all, the etching time is only controlled manually. The drying process takes place by manually blowing off the substrate with clean and dry nitrogen.

This described manual etching process particularly has following disadvantages:

- Manual execution leads to inevitable, meaning for example operator-dependent, non-reproducible conditions and errors.
- The prior-art method cannot be easily scaled from 10×10 $cm^2$ up to larger substrate surfaces, since the manual immersion practically and inevitably leads to a nonhomogeneous etching result on a larger surface.
- The prior-art method only permits a small flow-rate and is difficult to automate. In an industrial production environment, this would disadvantageously result in high costs.

OBJECT OF THE INVENTION

The object of the invention is to provide a method for cleaning ZnO layers and for permitting the implementation of line separation, after structuring of the layer in conjunction with wet-chemical roughening of the layer, with the least technical and time-related effort in a reproducible homogeneous manner on larger surfaces of usually 1 $m^2$ or greater. The object of the invention is also to provide a particularly advantageous method with which a drying process of the etched disks can immediately follow the described etching and cleaning.

SUMMARY OF THE INVENTION

The objects of the invention are achieved with a method in which the treatments with the etching fluid and the cleaning fluid take place while the substrate is conveyed through a device comprising a first means for treating the substrate with an etching fluid, a second means for treating the substrate with a cleaning fluid and a further means for conveying the substrate from the first to the second means.

The invention provides an advantageous combination of the cleaning and etching of laser-structured ZnO layers on various rigid or flexible support materials, as for example glass or plastic film, used for extensive substrates in a single process step. In an advantageous modification/extension of the invention, an additional drying process of the substrate is added in such a way that the entire surface of the substrate being coated in the subsequent process steps does not come into contact with any material, such as transport rollers, during the following drying process.

The invention relates to a method that advantageously permits the cleaning and the required etching in a single process step in that a cleaning/etching device in the form of a conveyor-type spray-etching machine is used. The substrate size is therefore not subject to any basic restrictions. The ZnO on a support can be roughened, rinsed and thus also cleaned and advantageously immediately homogeneously dried on the entire substrate surface and with an exact adjustable etching time.

The device according to invention suitable for performing the method is a conveyor-type etching machine, in which a large ZnO-coated substrate is conveyed from an intake area through etching, rinsing and drying chambers to an output area. The etching and/or rinsing solutions are applied particularly by spray nozzles. Advantageously, the conveyance can take place by means of a system of transport rollers resistant to acids and lyes.

The process cycle according to invention is systematically described in the following.

| Process step 1 | Wetting of the TCO coated substrate with ultra pure water. |
| --- | --- |
| Purpose: | Immediate dilution of possible inadvertently downward dripping etching agent into the following etching step. |
| Process step 2 | Spraying of the etching solution. |
| Purpose: | Homogeneous application of the etching agent on the entire substrate surface. |
| Process step 3 | Rinsing of the substrate with water or a rinsing solution. |
| Purpose: | Rapid removal of the etching agent for immediate termination of the etching process. |
| Process step 4 | If needed one-time or multiple repetitions of process step 3. |
| Purpose: | Improved rinsing result. Remark regarding process steps 3 and 4: To obtain a residue-free substrate surface, it is of advantage to keep the rinsed substrate moistened with rinsing solution directly up to the start of the drying process to avoid disadvantageous drying of the rinsing solution residue. |

An advantageous extension/modification of the invention entails a further process step 5, in which the substrate is dried. The objective is a homogeneous, residue-free removal of all residue of the rinsing medium should an immediate coating step directly follow this process.

The temperature of the etching agent can be adjusted and controlled in an advantageous embodiment of the invention. To obtain reproducible etching results, prior to etching the conductivity of the etching medium can additionally be determined and in case of a deviation from the target value it can be readjusted. The etching medium type can be freely selected by a person skilled in the art in the context of the stability of the employed materials and can be adapted to the process requirements. The entire machine is designed to be acid- and lye-resistant and should comprise at least one exhaust opening for the extraction of gases. In an advantageous embodiment of the device, the conveying speed of the substrate is continuously variable and thus serves for exact control of the etching time. The layer characteristics are determined immediately before and immediately after the process. Via a loop, the results of the layer characterization automatically impact the etching conditions, particularly the substrate speed (meaning the etching time), so that a consistent etching result is guaranteed.

The optional drying process of the substrate can also be performed in a conveyor-type machine by using, for example, air curtains positioned very closely above and below the substrate. An air flow angle that has been accordingly adjusted and air pressure above and underneath the substrates ensure that the entire surface to be coated does not come into contact during the drying process with any materials such as the transport rollers, but ensures uninterrupted conveyance.

Special Description

The object of the invention will be explained in more detail with reference to the figures, however without limiting the invention to them.

An existing etching device from the field of printed-circuit board production was used as an embodiment and was modified for the purpose according to invention (etching of wide substrate surfaces coated with ZnO). In the demonstration machine available at Forschungszentrum Jülich GmbH, substrates with surfaces measuring up to 40×40 cm² can be used. The modifications of the described embodiment are as follows:

The machine is arranged as a horizontal machine with transport rollers in a horizontal position and horizontal conveyance of the substrate.

The wetting (process step 1) takes place manually outside of the equipment. The etching agent used is 0.5% hydrochloric acid (HCl).

The etching agent is contained in a perfectly sealed container before and after the use of the machine. This prevents the evaporation of the etching agent as long as no process is in progress.

The speed can be adjusted with high accuracy and can be reproduced by means of a digital controller.

In the first rinsing step (first rinsing chamber) de-mineralized water is sprayed, and deionized water in the second rinsing chamber.

All parts coming into contact with the etching solution, including the drying device, are made of acid-resistant synthetic or titanium.

Titanium rails on the sides prevent sharp edged glass panes from becoming stuck.

The substrate thickness can be varied between 1 and 4 mm by using appropriate wedges.

DETAILED DESCRIPTION

Figure 1:
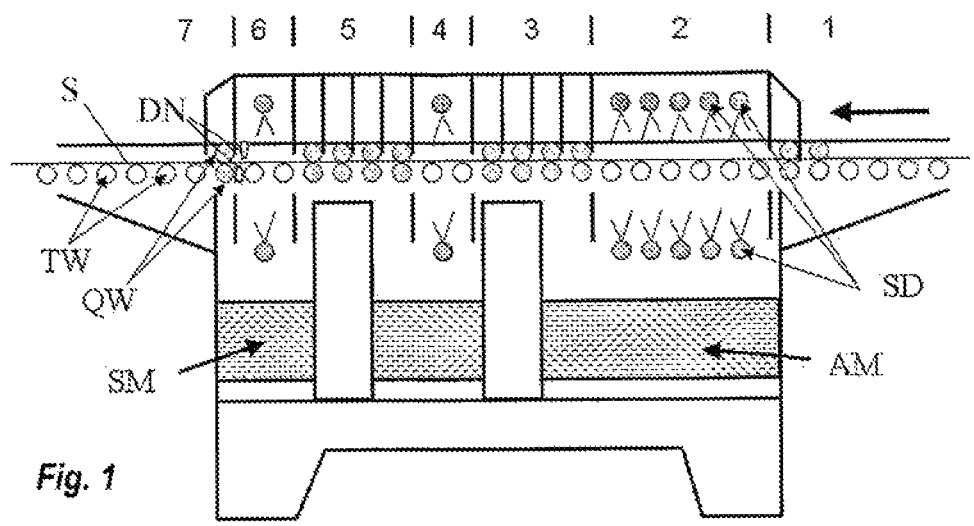
FIG. 1: A layout of the conveyor-type etching machine available at Forschungszentrum Jülich GmbH with
1=intake zone;
2=etching zone;
3, 5=squeezing zones;
4, 6=rinsing zones;
7=output zone
AM=etching agent
SM=rinsing agent
SD=spray nozzles
TW=transport rollers
QW=press roller
DN=drying nozzle
S=substrate
Figure 2:
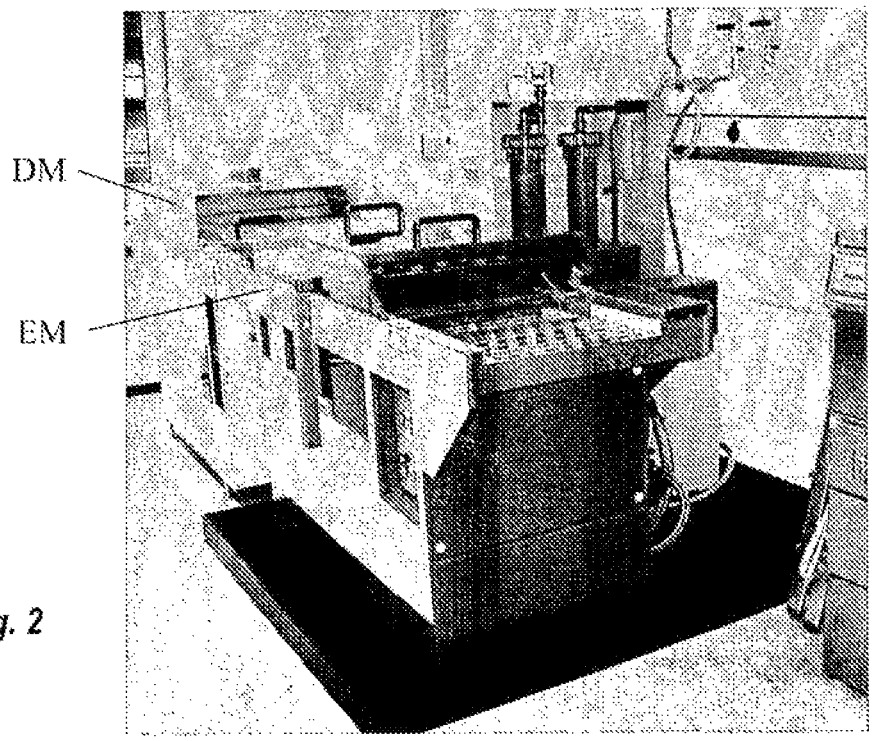
FIG. 2: Is a demonstration machine of a conveyor-type etching machine EM (in the front) and conveyor-type drying (in the back) machine DM available at Forschungszentrum Jülich GmbH. The conveyor-type machine is still under development and is constantly being optimized.

The current demonstration machine is quite flexible and can receive substrate sizes from 10×10 cm² up to 40×40 cm². An adaptation to further sizes is possible without difficulty. When using fixed substrate sizes, it is conceivable that the narrow transport rollers are only provided on the edges of the chambers and thus only come into contact with the substrate at the border of the ZnO/glass substrate. This would be of advantage, since consequently the glass does not come into contact with a conveyance system, including with the bottom side, and thus ideally is not subject to any potential contamination and/or other effects.

For the use of flexible substrates, a so-called roll-to-roll process is conceivable, in which a ZnO coated flexible film (metal, synthetic) is used instead of glass substrates, which film is unwound from a reel at the intake side of the device and rewound at the output. A dry film would be advantageous here.

The horizontal position of the substrate in the machine is not imperative. A vertical arrangement could even be advantageous, since dripping etching agent, for example, would not land directly on the ZnO/glass substrate. On the other hand, the vertical position has the disadvantage that the etching and rinsing agents run down on the substrate simply due to the force of gravity and therefore possibly impair the homogeneity of the etching process. The etching agent is usually distributed evenly and is also evenly rinsed off in a horizontal position.

The described spraying of the solutions on the substrate is not imperative. Spray nozzles, however, are usually very efficient, simple and economical. The following alternatives are also conceivable and suitable in the context of the invention.

A: The substrate runs through a wide etching and rinsing bath that contains the etching and/or rinsing agents. Disadvantages that should be mentioned here are that the process is difficult to control in terms of the etching time. Shorter etching times within a range of less than 20-40 s are typically more difficult to adjust. Furthermore, such a mount is mechanically more complicated, since the substrate must overcome vertical height differences when driven into or out of the basin.

B: An acid film is allowed to run from above onto the entire width of the substrate. More difficult technical implementation, control and reproducibility are to be expected here.

The invention claimed is:

1. A device for treating a substrate having pre-structured zinc-oxide layers, the device comprising:
   a machine having an intake and an output;
   first means in the machine adjacent the intake for treating the substrate with an etching fluid;
   second means in the machine between the first means and the output for treating the substrate with a cleaning fluid;
   third means in the machine between the second means and the output for drying the substrate, the first, second, and third means having surfaces resistant to the fluids, the third means including air curtains closely juxtaposed above and below the substrate; and
   transport means extending through the machine and resistant to the fluids for conveying the substrate from the intake to the output, an air flow angle of the curtains and an air pressure of the curtains being such that the substrate does not come into contact during drying with any part of the transport means.

2. The device according to the preceding claim 1 wherein the transport means has rollers.

3. The device according to claim 1, further comprising a drive mechanism that is able to drive the transport rollers.

4. The device according to claim 3 wherein the transport rollers are arranged such that they are able to convey the substrate horizontally.

5. The device according to claim 1 wherein substrates with a zinc oxide surface of more than 0.16 $m^2$ can be treated.

6. The device according to claim 1 wherein spray nozzles are used as the first or second means.

7. The device according to claim 6 wherein the spray nozzles are above the transport means.

8. The device according to claim 1, further comprising
   at least one temperature-controlled spray nozzle as the first means or the second means.

9. The device according to claim 1, further comprising between the means for treating the substrate with an etching fluid and the means for treating the substrate with a cleaning fluid
   rollers able to wipe off fluids on surfaces of the substrate.

10. A method for treating a substrate having pre-structured zinc-oxide layers, the method comprising the steps of:
    conveying the substrate through a device from an intake of the device to an output of the device with all internal surfaces resistant to acids and bases;
    treating the layers on the substrate in the machine with an etching medium adjacent the intake,
    thereafter treating the substrate with a cleaning fluid; and
    thereafter in the machine drying the fluids off the substrate adjacent the output with air curtains closely juxtaposed above and below the substrate.

11. The method according to the claim 10 wherein several of the substrates are treated successively.

12. The method according to claim 10 wherein the substrate is conveyed through the device by transport rollers.

13. The method according to claim 10 wherein a substrate has a surface area of more than 0.5 $m^2$.

14. The method according to claim 10 wherein the treatments of the substrate with an etching medium and a cleaning fluid are effected by spray nozzles.

15. The method according to claim 10 wherein the substrate is conveyed horizontally with the through the device with the layers upward, and the treatments with an etching medium and a cleaning fluid are effected from above by spray nozzles.

16. The method according to claim 10, further comprising the step of:
    controlling a temperature of the etching medium or the cleaning fluid.

17. The device defined in claim 10 wherein the machine has surfaces of acid-resistant titanium or plastic exposed to the etching fluid and cleaning fluid.

* * * * *